United States Patent [19]

Rogers et al.

[11] Patent Number: 5,355,032
[45] Date of Patent: Oct. 11, 1994

[54] TTL TO CMOS TRANSLATOR CIRCUIT AND METHOD

[75] Inventors: Alan C. Rogers, Palo Alto; Bal S. Sandhu, Fremont, both of Calif.

[73] Assignee: Sun Microsystems, Inc., Mountain View, Calif.

[21] Appl. No.: 36,613

[22] Filed: Mar. 24, 1993

[51] Int. Cl.$^5$ .................................. H03K 19/01
[52] U.S. Cl. .................................. 307/475; 307/443; 307/446
[58] Field of Search ............... 307/443, 446, 451, 475, 307/264

[56] References Cited

U.S. PATENT DOCUMENTS 3,739,194  6/1973  Freeman .
4,347,447  8/1982  Proebsting .
4,471,242  9/1984  Noufer .
4,677,593  6/1987  Davis .
5,087,841  2/1992  Rogers .
5,151,620  9/1992  Lin ...................... 307/475
5,157,281  10/1992  Santin et al. .............. 307/475 X Primary Examiner—David R. Hudspeth
Attorney, Agent, or Firm—James W. Rose

[57] ABSTRACT

A high speed, low powered, BiCMOS TTL to CMOS translator circuit and method which relies on an internally generated reference voltage and which is capable of driving high loads. The translator circuit includes a first inverting and translating stage having a pull up transistor and a pull down transistor, a high gain stage and a second inverting stage.

30 Claims, 2 Drawing Sheets

TTL TO CMOS TRANSLATOR CIRCUIT AND METHOD

BACKGROUND OF THE INVENTION

1. Field of the Invention

The present invention relates to a transistor to transistor logic (TTL) to complementary metal oxide semiconductor (CMOS) translator, and more particularly to a high speed, low powered BiCMOS TTL to CMOS translator which relies on an internally generated reference voltage and is capable of driving high loads.

2. Background of the Invention

TTL to CMOS translators are used to convert a logical signal within the TFL operating range into the CMOS operating range. TTL to CMOS translators are commonly found at the input buffers of an integrated circuit (IC) which contains CMOS circuitry. The translator converts a logical high TTL input signal into a logical high CMOS signal and a logical low TL input signal into a logical low CMOS signal.

The TTL operation range is typically between 0.0 to 3.0 volts. A signal between 0.0 and 0.8 volts is a logical low and a signal between 2.0 and 3.0 volts is a logical high. CMOS circuits operate between the full range of Vss and Vcc. If Vss=0.0 volts and Vcc=5.0 volts, then a signal between 0.0 and 2.5 volts is a logical low and a signal between 2.5 and 5.0 is a logical high.

Referring to FIG. 1, a TTL to CMOS translator according to the prior art is shown. The TTL to CMOS translator 10 has a first inverter stage 12 including PMOS transistor M14 and NMOS transistor M16 and a second inverter stage 18 including PMOS transistor M20 and NMOS transistor M22. During operation, a TTL input signal is applied to the input node of first inverter stage 12. This first stage 12 inverts the signal and performs the full TTL to CMOS conversion. The potential at node A is at the full CMOS level (either at Vcc or Vss), but is logically opposite to that of the signal applied at the input node. For example, if a logical high TTL signal is applied to the input node, NMOS transistor M16 is turned on. As a result, node A is pulled down to Vss. Transistor M20 of the second inverter stage 18 pulls up the low CMOS level signal to Vcc, thereby completing the TTL to CMOS translation. If a logical low TTL signal is applied at the input, the complement of the above occurs and the output node is pulled down to Vss.

The TTL to CMOS translator of FIG. 1 has a significant power dissipation problem. When a logical high TTL signal (approximately 2.0 volts) is applied to the input node of translator 10, this voltage is below the turn off voltage of PMOS transistor M14 and above the turn off voltage of NMOS transistor M16. It has been found that when both transistors are on, translator 10 dissipates approximately 2.0 mA of current. The use of multiple translation circuits 10 would therefore quickly exceed the total power budget for most chips. It would not be desirable to use the translator circuit 10 for a complex chip such as a microprocessor, which may require one hundred or more TTL to CMOS translator circuits.

Referring to FIG. 2, another TTL to CMOS translator according to the prior art is shown. This translator 30 has an inverting input stage 31 including PMOS transistor M32 and NMOS transistor M33, an intermediate stage 34 including a pair of cross coupled PMOS transistors M35 and M36 and NMOS transistors M37 and M38, and an output stage 38 including PMOS transistor M39 and NMOS transistor M40.

The input stage 31 inverts the input TTL signal and performs the TTL to CMOS conversion. For example, when a low TTL signal is applied to the input, PMOS transistor M32 pulls up node A to Vref. (The potential of Vref is equal to or slightly less than (2.0+Vt), where Vt is the turn on threshold of PMOS transistor M32.) Since node A is high, transistor M37 is turned on and node B$^1$ is pulled down to Vss. Transistor M36 is then turned on, node B is pulled up to Vcc, causing transistor M35 to turn off. No current can pass through node B$^1$ since transistor M35 is off. NMOS transistor M38 is turned off by the low TTL input, and, therefore, no current can pass through node B. The output stage 38 then inverts the Vcc potential at node B to Vss to complete the TTL to CMOS conversion. If a logical high TTL signal is applied at the input, the complement of the above occurs and the output node is pulled up to Vcc.

The translator 30 of FIG. 2 has several power saving features. The cross coupled PMOS transistors M35 and M36 prevent any current from being dissipated through the intermediate stage 34, thus reducing the amount of DC power being consumed. The externally generated reference voltage (Vref<2.0+Vt) is supplied to the source of PMOS transistor M32. When a high TTL signal (2.0 volts) is applied to the input node of translator 30, PMOS transistor M32 is turned off because the difference between the gate voltage and Vref is less than the threshold voltage of the transistor. The DC current dissipation through transistor M32 is cut off as a result, effectively reducing the DC power consumption of the circuit. In the prior art, voltage supply Vref is generated by a constant current source such as a band gap reference or by a current mirror (not shown).

The translator 30, however, also has a number of significant problems. In particular, the external band gap reference or current mirror used to create Vref is susceptible to voltage fluctuations due to coupling from nearby alternating current lines. These fluctuations may cause the transistor M32 to inadvertently turn on, thereby leaking current and increasing power consumption. Another disadvantage of translator circuit 30 is its slow switching speed. The Vcc potential at either node B or node B$^1$ must dissipate before the translator 30 can latch a new TTL input signal. As a result, symmetrical switching characteristics are not obtainable and a recovery time is required after each translation. Yet another disadvantage of the translator circuit is it relies solely on CMOS devices which generally have poor gain characteristics. In order to increase drive capability of the circuit, it is required to fabricate large transistors on the die, which wastes valuable space on the die.

SUMMARY OF THE INVENTION

The present invention provides a high speed, low powered, BiCMOS TTL to CMOS translator circuit and method which relies on an internally generated reference voltage and which is capable of driving high loads. The translator circuit includes a first stage, a high gain state and a second inverting stage.

The first inverting stage inverts the logic state of the TTL input signal and translates it to the CMOS operating range. The first stage includes a pull up transistor, a pull down transistor and a switched reference voltage which is generated internal to the translator circuit.

When the signal at the input is low, the reference voltage is switched to a low potential to drive the pull up transistor and inverting the input signal. When the signal is high, the reference voltage is switched to a high potential which turns off the pull up transistor, allowing the signal to pull down.

The high gain stage includes a bipolar transistor for increasing the drive capability of the circuit. The base of the bipolar transistor is coupled to the output of the first inverting stage. The bipolar transistor increases the current gain of the signal in response to transitions of the signal at the first inverting stage. Thus the gain stage provides the advantages of high ,gain using a single transistor, minimal power dissipation in the steady state, and fast and symmetrical switching characteristics regardless of whether the signal has a transition of high to low or vice versa.

The second inverting stage is used to convert the inverted CMOS level signal to the original logic state. In various embodiments of the invention, the second inverter stage may include multiple pull up transistors and multiple pull down transistors. If the additional pull up and pull down transistors are used, the translator circuit will have faster switching characteristics, but at the expense of using more area on the die.

The translator circuit of the present invention has a number of advantages over the prior art. The circuit accomplishes high speed TTL to CMOS translation with minimal power consumption. The circuit uses an internally generated reference signal so that the problem created by alternating current coupling and crosstalk from adjacent circuits is eliminated. The circuit implements BiCMOS technology to achieve the necessary load driving characteristics, speed, and accuracy for complex ICs such as microprocessors. The use of a high gain bipolar transistor in the gain stage permits symmetrical switching and minimal recovery time is required after each translation. Lastly, the overall size or layout of the circuit on the semiconductor chip may be reduced.

DESCRIPTION OF THE DRAWINGS

The objects, features and advantages of the present invention will be apparent from the following description in which.

DESCRIPTION OF THE PREFERRED EMBODIMENT

Figure 1:
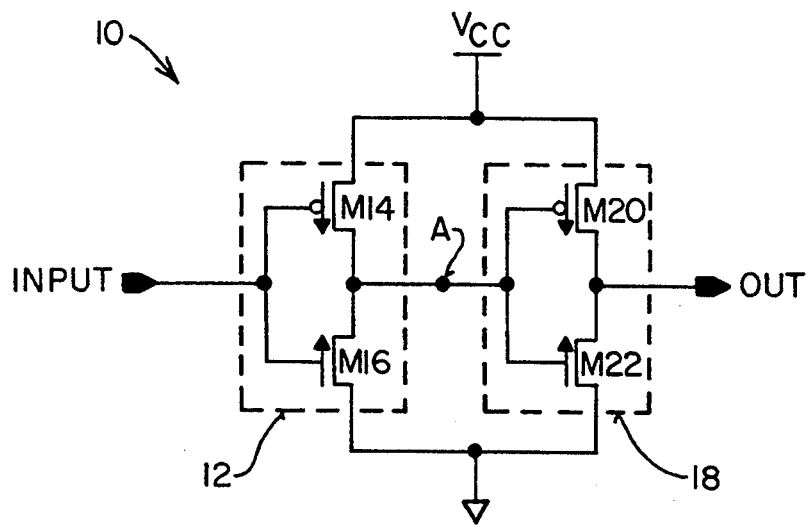
FIG. 1 illustrates a TTL to CMOS translator in accordance with the prior art.
Figure 2:
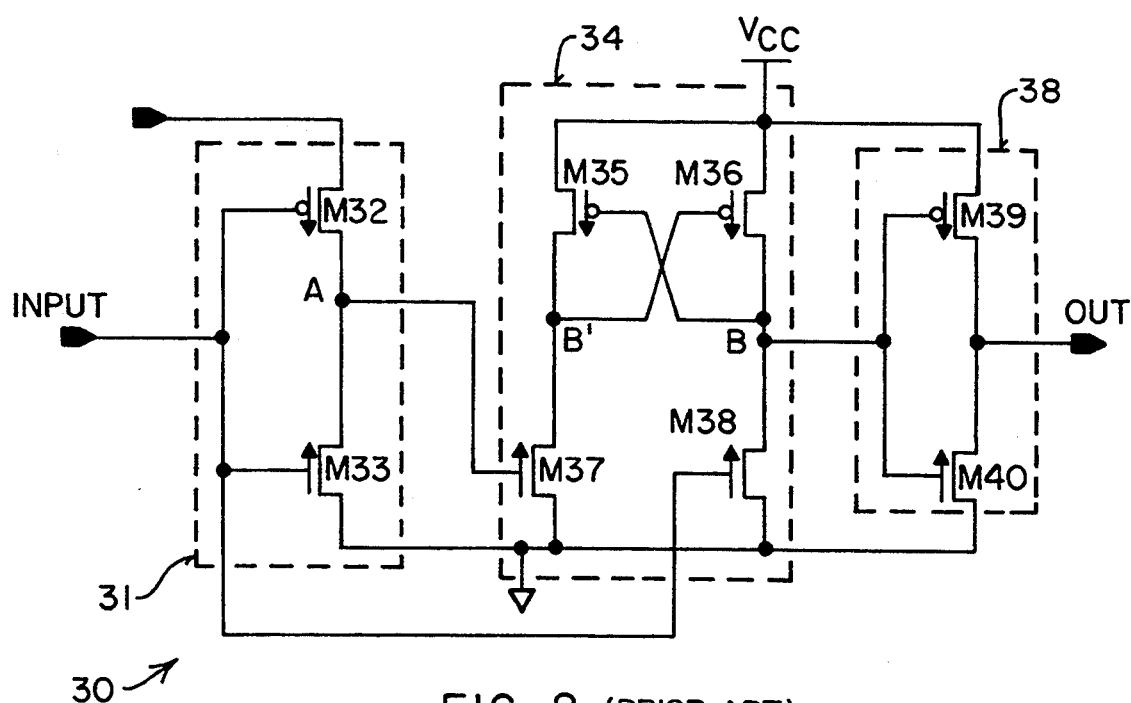
FIG. 2 illustrates another TTL to CMOS translator in accordance with the prior art.
Figure 3:
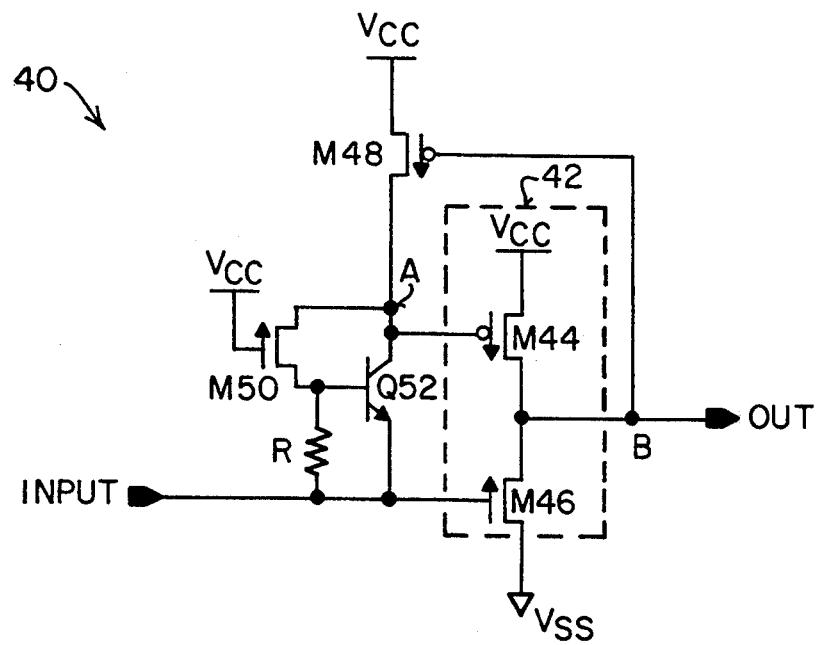
FIG. 3 illustrates a TTL to CMOS translating inverter in accordance with one embodiment of the present invention.

Referring to FIG. 3, a TTL to CMOS inverter according to the present invention is shown. The inverter 40 receives a TTL input signal of one logical state and inverts it to the opposite logical state at CMOS levels. For example, a logical high TTL signal is converted into a logical low CMOS signal. The inverter 40 is a basic component to the TTL to CMOS convertor of the present invention, and is therefore described in detail herein.

The inverter 40 has an input stage 42 including PMOS transistor M44 and NMOS transistor M46, a switching PMOS transistor MdS, and an internal reference voltage source including NMOS transistor MS0 and bipolar transistor Q52. The gate of NMOS transistor M46 is coupled to the input node of the inverter 40. The gate of PMOS transistor M44 is coupled to node A. The source-drain current path of PMOS transistor Mdd and the source drain current path of NMOS transistor M46 are serially connected between Vcc and Vss. The output node B of inverter 40 is defined as the point between the channels of these two transistors. The gate of voltage reference transistor M50 is coupled to VCC, and its source and drain are coupled to the base of bipolar transistor Q52 and node A respectively. The collector of bipolar transistor Q52 is coupled to node A and its emitter is coupled to the input node. The output node B is coupled to tile gate of transistor M48. The source drain current path of transistor M48 is coupled between Vcc and node A. In an alternative embodiment, a resistor R may be placed between the base of transistor Q52 and the input node. This resistor will prevent any current from leaking through Q52 when the transistor is off.

In the event that a high TTL signal (>2.0 volts) is applied to the input node, NMOS transistor M46 is turned on and the output node B is pulled to Vss. As the output node is pulled to Vss, switching PMOS transistor M48 turns on and pulls up node A to Vcc, and, as a restnit, PMOS transistor M44 is shut off. Thus, the output node is maintained at Vss and the inversion and translation of the TTL input signal to CMOS is completed. It is useful to note that when the input is at a typical high level of 3.0 volts, the potential at the emitter of transistor Q52 is slightly lower than tile potential at its base. The base potential is equal to Vcc—Vt of transistor M50 (5.0-1.5= 3.5 volts), which is approximately one-half volt above the emitter potential. As a result, transistor Q52 is on very soft and has a minimal effect in pulling down the potential at node A. In a preferred embodiment, bipolar transistor Q52 is sized small to further reduce its pull down effect and the amount of current being dissipated.

It is useful to note the advantages of the configuration including transistors M48, M50 and Q52. These transistors provide a switching voltage at node A. When a high TTL signal is present at the input node, node A is held at a constant high voltage to maintain PMOS transistor M44 in the off state. When a low TTL input signal is applied at the input node, node A is switched to a low potential and PMOS transistor M44 is maintained in the on state. Since the voltage is generated internal to the circuit, the problem associated with relying on a voltage reference generated elsewhere on the chip and routing the voltage to the translator circuit is avoided. Rather, the present invention of a local switched voltage which is less susceptible to voltage variations for each translator. This switching feature optimizes the performance of the circuit.

In the event that a logical low TTL ($\leq 0.8$ volts) signal is present at the input node, NMOS transistor M46 is turned off. The voltage differential between the base and emitter of bipolar transistor Q52 is sufficiently large to turn transistor Q52 on hard. Node A is pulled down as a result and PMOS transistor M44 is turned on pulling up the output node B to Vcc. The switching PMOS transistor M48 is shut off as the potential at output node B rises. Thus the translation and inversion of a logical low TTL signal to Vcc is completed.

Figure 4:
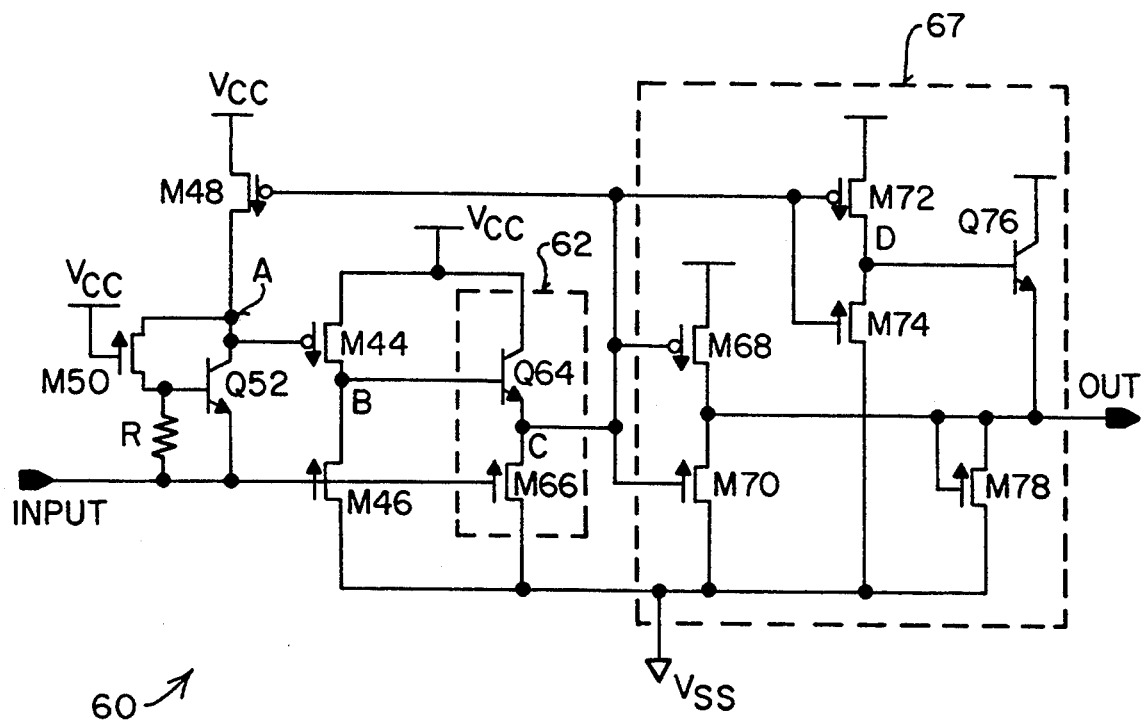
FIG. 4 illustrates a TTL to CMOS translator in accordance with another embodiment the present invention.

Referring to FIG. 4, a TTL to CMOS translator according to the present invention is shown. The TTL to CMOS translator 60 is a high speed, low power, BiCMOS circuit capable of driving high loads. The translator 60 includes the inverter 40 described above, and therefore, the circuit elements which perform the same or a similar function as described in FIG. 3 are indicated by the same reference numerals herein.

The translator 60 includes a high gain stage 62 including bipolar transistor Q64 and NMOS transistor M66. The base of transistor Q64 is coupled to node B and the gate of transistor M66 is coupled to the input node. The emitter-collector and source-drain paths of transistor Q64 and transistor M66 are coupled in series between Vcc and Vss. The point between the current path of the two transistors is defined as node C.

The translator also includes an inverter stage 67 including PMOS transistor M68, NMOS transistor M70, PMOS transistor M72, NMOS transistor M74, bipolar transistor Q76, and NMOS transistor M78. The gates of transistor M48, transistor M68, transistor M70, transistor M72 and transistor M74 are all coupled to node C. The source drain paths of transistor pair M68 and M70 and transistor pair M72 and M74 are respectively coupled in series between Vcc and Vss. The point between the current paths of transistors M72 and M74 is defined as node D. The point between the current path of transistors M68 and M70 is defined as the output node. The base of transistor Q76 is coupled to node D. The emitter collector path of transistor Q76 is coupled between Vcc and the output node. The gate and source of transistor M78 are coupled to the output node, and the drain is coupled to Vss.

The high gain stage 62 is responsible for increasing the switching speed of translator circuit 60. This is accomplished by bipolar transistor Q64. When the potential at node A begins to fall, PMOS transistor M44 gradually turns on and current begins to pass through node B. A small increase of current at node B will quickly turn on bipolar transistor Q64, rapidly pulling up node C. Conversely, when transistor M44 begins to turn off and the current through node B begins to decrease, bipolar transistor Q64 quickly shuts off. As a result, transistor M66 rapidly pulls down node C to Vss. Accordingly, in the present invention, symmetrical switching is obtained and minimal recovery time is required after each translation by circuit 60. Furthermore, the gain stage dissipates no power in the steady state.

The high gain stage 62 also increases the drive capability of the translator circuit 60. In a prembodiment, bipolar transistor Q64 amplifies the base current at node B and therefore increases the drive capability of the translator circuit 60. Since the high gain stage is responsible for the gain characteristics of the translator 60, the other transistors in the circuit can be made much smaller. This too increases the switching speed of the circuit and saves valuable area on the die. It will be obvious to those skilled in the art that transistor Q64 can be sized to meet the drive requirements of the circuit. A relatively large size transistor Q64 will be capable of driving a high load.

The second inverter stage 67 is responsible for converting the translated but inverted CMOS signal at node C to its proper logical state. For example, if the input node receives a logical high TTL signal, node C is at Vss. The second inverter stage 67 is responsible for inverting the Vss potential at node C to Vcc at the output node. When the potential at node C is at Vss, transistor M68, transistor M72 and transistor Q76 all turn on, thus pulling the output node up to Vcc to complete the CMOS translation. Since Q76 is a bipolar transistor, the output node is quickly pulled up to the rail Vcc. Conversely, if the input node is at a logical low TTL signal and node C is at Vcc, transistor M70 is turned on pulling down the output node to Vss, thus completing the CMOS translation. Transistor M78 is acting as a resistor which prevents the output node from rising above Vcc when Q76 is on.

In an alternate embodiment, either one or two of the pull up transistors M68, M72 and Q76 may be eliminated. It would be obvious to one skilled in the art to select the size and number of the pull up transistors to match the load the circuit is driving.

In yet another embodiment, the gate of the transistor M68 may be coupled to Vcc instead of node C. This configuration will increase the switching speed of the circuit because the output will swing between Vcc-Vbe and Vss rather than the full swing of Vet and Vss, and the load on node C is reduced.

The translator circuit 60 has a number of advantages over the prior art. The circuit accomplishes high speed WL to CMOS translation with minimal power consumption. The circuit uses an internally generated reference signal so that the problem created by alternating current coupling and crosstalk from adjacent circuits is eliminated. The circuit implements BiCMOS technology to achieve the necessary load driving characteristics, speed, and accuracy/br complex microprocessors and other ICs. The size or layout of the circuit on the semiconductor chip is reduced. Lastly, symmetrical switching is obtained and minimal recovery time is required after each translation.

While the invention has been described in relation to the embodiments shown in the accompanying Figures, other embodiments, alternatives and modifications will be apparent to those skilled in the art. It is intended that the specification be only exemplary, and that the true scope and spirit of the invention be indicated by the following claims.

What is claimed is:

1. A translator circuit, comprising:
   an input node for receiving a signal operating within a first operating range and at a first logic state;
   a translating inverter stage for converting the signal to a second logic state within a second operating range and providing the signal to an output node;
   a switched voltage generator internal to the translating inverter stage for supplying a switched voltage to the translating inverter stage;
   a gain stage, coupled to the output node of the translating inverter stage, for increasing the gain of the signal; and
   a second inverter stage, coupled to the gain stage, for inverting the inverted signal to the first logic state.

2. The transistor of claim 1, wherein, the gain stage symmetrically increases the gain of the signal in response to transitions of the signal at the output node of the translating inverter stage.

3. The translator of claim 11, wherein the gain stage comprises a bipolar transistor with its base coupled to the output node of the translating inverter stage.

4. The translator of claim 2 wherein the bipolar transistor of the gain stage is off during steady state, whereby gain stage dissipates minimal power during steady state operation.

5. The translator circuit of claim 2, wherein the switched voltage generator is switched depending on the logic state of the signal at the input node.

6. The translator of claim 3, wherein the switched voltage is switched to a high potential when the signal at the input node is at a high logic level.

7. The translator of claim 3, wherein the switched voltage is switched to a low potential when the signal at the input node is at a low logic level.

8. A circuit, comprising:
an input node for receiving an input signal that transitions between a first logic state and a second logic state;
an intermediate node for providing an intermediate signal complementary to the input signal;
a switchable voltage reference; and
a translating inverter stage coupled between the input node and the intermediate node, including:
a first translator circuit coupled to the input node for receiving the input signal; and
a second translator circuit coupled to the switchable voltage reference.

9. The circuit of claim 8, wherein the first translator circuit and the second translator circuit are complementary.

10. The circuit of claim 8 wherein the first translator circuit is a pull down transistor.

11. The circuit of claim 8, wherein the second translator circuit is a pull up transistor.

12. The circuit of claim 8, wherein the first translator circuit is further for pulling down the intermediate node when the input signal received at the input node is at the first logic state.

13. The circuit of claim 8, wherein the second translator circuit is for assuming a deactivated state when the input signal is at the first logic state.

14. The circuit of claim 8, wherein the switchable voltage reference is for controlling the second translator circuit.

15. The circuit of claim 14, wherein the switchable voltage reference is for activating the second translator circuit when the input signal received at the input node is at the second state.

16. The circuit of claim 14, wherein the first translator circuit is for assuming a deactivated state when the input signal is at the first logic state.

17. The circuit of claim 8, further comprising a control circuit for controlling the switchable voltage reference.

18. The circuit of claim 17, wherein the control circuit further comprises a charging circuit for charging the switchable voltage reference to a first predetermined voltage.

19. The circuit of claim 18, wherein the charging circuit is coupled between the intermediate node and the switchable voltage reference.

20. The circuit of claim 17, wherein the control circuit further comprises a switching circuit for switching the switchable voltage reference from a first predetermined voltage to a second predetermined voltage.

21. The circuit of claim 20 wherein the switching circuit is coupled between the input node and the switchable voltage reference.

22. The circuit of claim 10, wherein the switching circuit is further for switching the second translator circuit on and off in response to transitions of the input signal between the first logic state and the second logic state.

23. The circuit of claim 8, further comprising a gain stage coupled to the intermediate node.

24. The circuit of claim 23, wherein the gain stage further comprises an amplifying transistor coupled to the intermediate node.

25. The circuit of claim 8, further comprising a second inverter stage coupled to the intermediate node.

26. The circuit of claim 8, wherein the first translation circuit and the second translation circuit are further for performing a level shift of the input signal between the input node and the intermediate node.

27. A method of operating a circuit, comprising:
receiving an input signal that transitions between a first logic state and a second logic state;
generating a switchable voltage reference capable of switching between a first predetermined voltage and a second predetermined voltage and that switches in response to the first logic state and the second logic state of the input signal;
applying the input signal to the first translator circuit;
applying the switchable voltage reference to a second translator circuit;
operating the first translator circuit and the second translator circuit, in response to the input signal, to generate an intermediate signal complementary to the input signal received at the input node.

28. The method of claim 27 wherein the operation step further comprises the step of activating the first translator circuit and deactivating the second translator circuit when the input signal is at the first logic state.

29. The method of claim 27, wherein the operation step further comprises the step of deactivating the first translator circuit and activating the second translator circuit when the input signal is at the second logic state.

30. A method of providing a circuit, comprising the steps of:
providing an input node for receiving an input signal that transitions between a first logic state and a second logic state;
providing an intermediate node for providing an intermediate signal complementary to the input signal;
providing a switchable voltage reference; and
providing a translating inverter stage coupled between the input node and the intermediate node, further including including the steps of:
providing a first translator circuit coupled to the input node for receiving the input signal; and
providing a second translator circuit coupled to the switchable voltage reference.

* * * * *

UNITED STATES PATENT AND TRADEMARK OFFICE
CERTIFICATE OF CORRECTION

PATENT NO. : 5,355,032
DATED : October 11, 1994
INVENTOR(S) : Rogers et al.

It is certified that error appears in the above-identified patent and that said Letters Patent is hereby corrected as shown below:

In column 6, claim 3 at line 64, please delete " 11 " and insert -- 1 --.

In column 8, claim 22 at line 6, please delete " 10 " and insert -- 20 --.

Signed and Sealed this

Eighth Day of September, 1998

Attest:

BRUCE LEHMAN

Attesting Officer

Commissioner of Patents and Trademarks